United States Patent [19]
Martin et al.

[11] Patent Number: 6,066,609
[45] Date of Patent: May 23, 2000

[54] AQUEOUS SOLUTION FOR CLEANING A SEMICONDUCTOR SUBSTRATE

[75] Inventors: Andreas Martin, Frankfurt; Walter Hub; Bernd Kolbesen, both of München, all of Germany

[73] Assignee: Siemens Aktiengesellschaft, Munich, Germany

[21] Appl. No.: 09/243,298

[22] Filed: Feb. 2, 1999

Related U.S. Application Data

[63] Continuation of application No. PCT/DE97/01623, Jul. 31, 1997.

[51] Int. Cl.[7] .......................... H01L 21/306; C11D 7/50
[52] U.S. Cl. .................. 510/175; 510/435; 510/499; 510/504; 510/505; 510/506
[58] Field of Search .................. 134/2, 3; 510/175, 510/176, 435, 499, 505, 504, 506; 252/79.1, 79.2, 79.3, 79.4

[56] References Cited

U.S. PATENT DOCUMENTS

| | | | |
|---|---|---|---|
| 4,885,106 | 12/1989 | Lapham et al. | 252/100 |
| 5,049,201 | 9/1991 | Cheng et al. | 134/42 |
| 5,051,134 | 9/1991 | Schnegg et al. | 134/3 |
| 5,256,779 | 10/1993 | Kerschner et al. | 540/465 |
| 5,290,361 | 3/1994 | Hayashida et al. | 134/2 |
| 5,302,311 | 4/1994 | Sugihara et al. | 252/102 |
| 5,589,446 | 12/1996 | Unruh | 510/175 |
| 5,981,454 | 11/1999 | Small | 510/175 |

FOREIGN PATENT DOCUMENTS

| | | |
|---|---|---|
| 0 407 324 A2 | 1/1991 | European Pat. Off. . |
| 0 438 727 A2 | 7/1991 | European Pat. Off. . |
| 0 496 605 A3 | 7/1992 | European Pat. Off. . |
| 0 528 053 A1 | 2/1993 | European Pat. Off. . |
| 0 528 053 B1 | 2/1993 | European Pat. Off. . |
| 0 560 324 A1 | 9/1993 | European Pat. Off. . |
| 38 22 350 A1 | 1/1990 | Germany . |

OTHER PUBLICATIONS

Patent Abstracts of Japan No. 91–313788.
Patent Abstracts of Japan No. 94–104779.
"Cleaning Solution Based on Hydrogen Peroxide for Use in Silicon Semiconductor Technology" (Kern et al.), RCA Review, Jun. 1970, pp. 187–207.

*Primary Examiner*—Christine Skane
*Assistant Examiner*—Gregory Webb
*Attorney, Agent, or Firm*—Herbert L. Lerner; Laurence A. Greenberg; Werner H. Stemer

[57] ABSTRACT

Aqueous solutions for cleaning semiconductor substrates are formed primarily of a base, hydrogen peroxide and a complexing agent. The complexing agent is a heterocyclic hydrocarbon having a ring size of at least 9 and at most 18 atoms and at least 3 heteroatoms, for example nitrogen, oxygen or sulfur. In the case of nitrogen-containing cryptands, these may additionally be formed with functional reactive groups and/or aliphatic bridges between the nitrogen atoms (cage structures).

18 Claims, No Drawings

AQUEOUS SOLUTION FOR CLEANING A SEMICONDUCTOR SUBSTRATE

CROSS-REFERENCE TO RELATED APPLICATION

This is a continuation of copending International Application PCT/DE97/01623, filed Jul. 31, 1997, which designated the United States.

BACKGROUND OF THE INVENTION

Field of the Invention

The invention relates to an aqueous solution consisting of an organic or inorganic base, hydrogen peroxide and a complexing agent for cleaning a semiconductor substrate.

The process for the production of integrated circuits incorporates multiple cleaning steps for removing surface contamination. Contamination on the wafer surface can in the simplest case be removed by blowing-off with purified nitrogen. In most cases, however, this does not remove all the particles. Another possibility is rinsing with filtered deionized water (containing a wetting agent) or with suitable cleaning chemicals, such as acetone or isopropanol. This type of cleaning is either carried out in a tank under the action of ultrasound (MHz frequencies), or the liquid is sprayed at high speed onto the wafer surface from jets (jet scrubber). Mechanical brushing in a scrubber is also used, principally after CVD deposition. The particles that are brushed off are rinsed off the wafer surface using deionized water or a solvent.

In the production of integrated circuits, a number of chemical wafer cleaning steps is generally necessary. They are generally carried out after removal (stripping) of a resist mask and wherever possible immediately before a coating is applied. The semiconductor wafers are either dipped into suitable chemical baths, frequently under the action of ultrasound, or the cleaning liquid is sprayed onto the wafers in a cleaner.

A frequently used process is RCA cleaning (RCA Review, page 18–206, June 1970), which consists of two separate cleaning steps:

In the first cleaning step, RCA-1 or SC-1 (Standard Clean 1), the wafer to be cleaned is immersed in an alkaline cleaning solution consisting of one part of ammonia, one part of hydrogen peroxide and five parts of water, at a temperature of about 70° C. and then rinsed with ultrapure water in order to remove particles and organic contamination from the wafer surface.

This is followed by the second cleaning step, RCA-2 or SC-2 (Standard Clean 2). In this step, the wafer to be cleaned is dipped into an acidic cleaning solution consisting of one part of HCl, one part of hydrogen peroxide and six parts of water, at a temperature of about 70° C. This is again followed by rinsing with ultrapure water in order to remove the metal contamination originating, inter alia, from the SC-1.

In general, the wafer surfaces after the SC-1 treatment are contaminated by Fe, Al, Ca, Mg, Zn and/or Cu ions and/or other metallic ions. The metal contamination originates from the process steps carried out immediately before the cleaning step. Contamination arises through contact with stainless steel, leaching of metals from fittings and piping material and diverse types of metal contamination from individual processes in semiconductor manufacture, such as dry etching, ion implantation and coating with photoresists, etc.

After the SC-1 treatment, the surface of the wafer is usually contaminated by approximately $10^{11}$ to $10^{12}$ iron atoms per $cm^2$, approximately $10^{11}$ to $10^{13}$ aluminum atoms per $cm^2$, and approximately $10^{10}$ to $10^{11}$ copper and zinc atoms per $cm^2$.

In order to counter this problem, diverse complexing agents are nowadays added to the cleaning solutions. For example, Non-Prosecuted German Patent Application DE 38 22 350 A discloses a process in which ethylenediamine tetraacetate (EDTA) is proposed as the complexing agent. However, the use of EDTA has proven relatively ineffective.

Furthermore, European Patent Application EP 0 276 774 A discloses a cleaning solution in which pentavalent phosphorus compounds are proposed as the complexing agent. This proposed solution has also proven to be relatively ineffective in practice.

Finally, European Patent Application EP 0 496 605 A discloses a process for cleaning semiconductor substrate surfaces in which compounds containing phosphonic acid groups or salts thereof are proposed as the complexing agent. The phosphonic acid compounds prove to be very effective in practice against contamination by iron ions, which generally cause relatively severe problems. On the other hand, however, the phosphonic acid compounds proposed in European Patent Application EP 0 496 605 A do not have a complexing action vis-a-vis copper and zinc contamination.

Furthermore, all known wet-chemical wafer cleaning processes have the common feature that they must be carried out at a temperature of 70° C., which results in increased costs and equipment complexity. Furthermore, all known wet-chemical cleaning processes include two cleaning steps, as originating from the above-mentioned RCA cleaning.

SUMMARY OF THE INVENTION

It is accordingly an object of the invention to provide an aqueous solution for cleaning a semiconductor substrate which overcomes the above-mentioned disadvantages of the prior art solutions of this general type, that enables a considerable cost saving and significantly increased efficiency, compared with the known cleaning solutions.

With the foregoing and other objects in view there is provided, in accordance with the invention, an aqueous solution for cleaning a semiconductor substrate, including: a base; hydrogen peroxide; and a complexing agent being a crown ether having the formula:

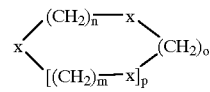

in which X is one of oxygen and sulfur, m, n and o are one of 2 and 3, and p is one of 1 and 2.

Other features which are considered as characteristic for the invention are set forth in the appended claims.

Although the invention is described herein as embodied in an aqueous solution for cleaning a semiconductor substrate, it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENTS

An aqueous cleaning solution is characterized in that a complexing agent provided is a crown ether of the formula:

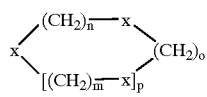

in which X is oxygen or sulfur, m, n and o are 2 or 3, and p is 1 or 2, or the complexing agent provided is a cryptand of the formula:

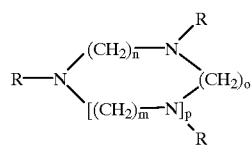

in which the R radicals are hydrogen atoms and/or aliphatic chains bridging two nitrogen atoms each and/or identical or different functional groups which affects:

1) the solubility of the cryptand and/or
2) the adduction of the cryptand onto the semiconductor substrate and/or
3) the metal complexability and/or
4) the stability of the cryptand to oxidants, and m, n and o are 2 or 3, and p is 1 or 2.

The aqueous cleaning solutions for the semiconductor substrates produce a cost saving since only the SC-1 cleaning step is necessary instead of the RCA sequence of SC-1 and then SC-2. Furthermore, the service lives of the cleaning baths are significantly increased, and the cleaning can be carried out at a temperature of less than or equal to 50° C.

Typical cryptands used are those in which the functional groups provided are carboxylic acid groups, (poly) methylenesulfonic acid groups, (poly)methylsulfinic acid groups or (poly)methylenesulfenic acid groups, or salts thereof.

In a preferred embodiment the functional groups provided on the cryptands are methylenephosphonic acid or polymethylenephosphonic acid groups, or salts thereof. The use of methylenephosphonic acid groups or polymethylenephosphonic acid groups has proven particularly advantageous since they allow the iron contamination to be removed extremely efficiently.

Typically, however, various functional groups can be present in a cryptand, meaning that the complexing agent is an effective instrument that is customized to the particular type of contamination. It must be noted, in particular, that zinc contamination and copper contamination can be removed effectively using the cryptands according to the invention, alone or together with crown ethers and crown thioethers.

The concentration of the complex-forming cleaning solutions according to the invention can be between 0.01 and 1000 ppm. The organic or inorganic base provided is preferably ammonia or a quaternary ammonium hydroxide, for example tetramethyleneammonium hydroxide (TMAH) or choline, where the concentration of the base in the cleaning solution according to the invention can be from 0.01 to 20% by weight. The cleaning solutions according to the invention preferably contain from 0.01 to 30% by weight of hydrogen peroxide.

It is furthermore proposed that one or more different complexing agents be employed in the cleaning solution for cleaning the silicon wafers. Preference is given here to ammonia, hydrogen peroxide and water in a ratio of from 0.25:1:5 to 1:1:5.

The complexing agents can, if desired, be used directly in the cleaning solutions. However, it is also feasible to use them in monomeric or polymeric form with suitable support materials in cleaning columns for continuous recycling of the cleaning solutions in semiconductor manufacture or in a separate recycling unit.

The process according to the invention is now illustrated in greater detail with reference to examples.

The cleaning solution used is a freshly prepared, dilute SC-1 solution (1:4:20) prepared as follows: the water component (20 parts by volume) is heated to 75° C. in a quartz tank, hydrogen peroxide (31%, 1 ng/g quality, 4 parts by volume) is then added, and ammonia solution (28%, 1 ng/g quality, 1 part by volume) is then added. After each addition, the solution is mixed. At the end of the mixing, it has reached a temperature of about 70° C. If desired (see below), an aqueous standard elemental solution of Al, Ca, Fe, Ni, Cu and Zn is added to this solution in such an amount that 1 ng/g per metal ion is added to the cleaning bath. Depending on the experiment, a solution of a complexing agent according to the invention is then or instead added in such an amount that its concentration in the cleaning bath reaches 1 $\mu$g/g.

Subsequently, at least two 150 mm silicon wafers (100) are in each case dipped into the solution for 10 minutes. The wafers have previously undergone standard precleaning. After the test, they are rinsed with ultrapure water for 10 minutes in an overflow tank at 20° C. and spin-dried. The wafers are subsequently analyzed for metallic contamination on the front by use of VPD-AAS and/or VPD-TRFA.

WORKING EXAMPLE 1

Dilute SC-1 cleaning solution with addition of complexing agent N,N',N"tri(methylenephosphonium)-1,4,7-triazacyclononane ("c-TRAMP").

After the cleaning bath has been prepared by the process described above, a solution of the complexing agent ("cTRAMP") in ammoniacal solution is added. The average values of the metal contamination on the surfaces of six test wafers are given in Table 1. The action of the complexing agent according to the invention reduces the contamination by Fe, Ni, Cu and Zn on the wafers (see Comparative Example 1).

TABLE 1

Metal contamination on the wafer surface after SCÄ1 cleaning (1:4:20, 70° C.) with complexing agent cTRAMP (1 $\mu$g/g):

| Cleaning solution | Metal contamination on the wafer surface ($10^{10}$ atoms per cm$^2$) | | | | |
| --- | --- | --- | --- | --- | --- |
|  | Ca | Fe | Ni | Cu | Zn |
| SC-1 + ctramp | 4.3 | <0.2 | <0.1 | <0.1 | 0.5 |

WORKING EXAMPLE 2

Dilute SC-1 cleaning solution with addition of 1 ng/g of each of Al, Ca, Fe, Ni, Cu, Zn and complexing agent N,N',N"tri(methylenephosphonium)-1,4,7-triazacyclononane ("cTRAMP").

After the cleaning bath (volume 18.75 l) had been prepared by the above process, 1.875 ml of an aqueous multielement solution containing 10 µg/g of each of Al, Ca, Cu, Fe, Ni and Zn was added, resulting in addition of a concentration of 1 ng/g of each of these elements to the cleaning bath. The complexing agent N,N',N"tri(methylenephosphonium)- 1,4,7-triazacyclononane ("cTRAMP") in ammoniacal solution is then added. The metal contamination on the surfaces of two test wafers is given in Table 2. The result shows that the complexing agent prevents deposition of the metals Fe, Ni, Cu and Zn even in the highly contaminated cleaning solution (see Comparative Example 2). The wafer surfaces are of comparative cleanliness to Working Example 1 and are thus cleaner than with high-purity chemicals without addition of complexing agent (Comparative Example 1).

TABLE 2

Metal contamination on the wafer surface after SC-1 cleaning (1:4:20, 70° C.) with addition of 1 ng/g of Al, Ca, Fe, Ni, Cu, Zn and complexing agent cTRAMP:

| Cleaning solution | Metal contamination on the wafer surface ($10^{10}$ atoms per cm$^2$) | | | | |
|---|---|---|---|---|---|
| | Ca | Fe | Ni | Cu | Zn |
| SC-1 + metals (1 ng/g) + cTRAMP | 9.2 | <0.2 | <0.1 | <0.1 | 0.5 |

WORKING EXAMPLE 3

Dilute SC-1 cleaning solution with addition of 1 ng/g of each of Al, Ca, Fe, Ni, Cu, Zn and the complexing agents diethylenetriaminepenta (methylenephosphonic) acid ("DTTP") and 1,4,8,11-tetraazacyclotetradecane-N,N',N",N'" (tetraacetic) acid ("TETA").

In this experiment to study the action of a complexing agent according to the invention with respect to aluminum, the metal ions were added to the DIW (75° C.) before the addition of TETA (300 µg/g), DTTP (4 µg/g), H$_2$O$_2$ and NH$_4$OH.

Comparison of the surface contamination with Comparative Example 5 shows that the complexing agent TETA reduces deposition of Al onto the wafers.

TABLE 3

Metal contamination on the wafer surface after SC-1 cleaning (1:4:20, 70° C.) with addition of 1 ng/g of Al, Ca, Fe, Ni, Cu, Zn and complexing agents DTTP (4 ug/g) and TETA (300 ug/g)

| Cleaning solution | Metal contamination on the wafer surface ($10^{10}$ atoms per cm$^2$) Al |
|---|---|
| SC-1 + metals (1 ng/g) + DTTP + TETA | 100 |

COMPARATIVE EXAMPLE 1

Dilute SC-1 cleaning solution without complexing agent

The same experiment as in Use Example 1, but without the addition of a complexing agent, results, in 18 test wafers, in the average contamination values shown in Table 4. The contamination is determined through the purity of the chemicals used and the experimental conditions.

TABLE 4

Metal contamination on the wafer surface after SC-1 cleaning (1:4:20, 70° C.)

| Cleaning solution | Metal contamination on the wafer surface ($10^{10}$ atoms per cm$^2$) | | | | |
|---|---|---|---|---|---|
| | Ca | Fe | Ni | Cu | Zn |
| SC-1 | 3.8 | 3.5 | 0.3 | 0.2 | 4.4 |

COMPARATIVE EXAMPLE 2

Dilute SC-1 cleaning solution with addition of 1 ng/g of each of Al, Ca, Fe, Ni, Cu and Zn without the complexing agent.

After preparation of the cleaning solution as described above, the solution of the metal ions indicated was added and the wafer test was carried out. The average values of the metal contamination on the surface of 15 wafers are shown in Table 5. Significant contamination by Fe, Ni and Zn is apparent.

TABLE 5

Metal contamination on the wafer surface after SC-1 cleaning (1:4:20, 70° C.) with addition of 1 ng/g of Al, Ca, Fe, Ni, Cu, Zn without the complexing agent:

| Cleaning solution | Metal contamination on the wafer surface ($10^{10}$ atoms per cm$^2$) | | | | |
|---|---|---|---|---|---|
| | Ca | Fe | Ni | Cu | Zn |
| SC-1 + metals (1 ng/g) | 4.1 | 120 | 1.0 | 0.3 | 32 |

COMPARATIVE EXAMPLE 3

Dilute SC-1 cleaning solution with addition of 1 ng/g of Al, Ca, Fe, Ni, Cu and Zn and the complexing agent ethylenediamine tetraacetate (EDTA).

After preparation of the cleaning solution (1:4:20, 70° C.) as above, the solution of the metal ions and then the complexing agent (EDTA) in a concentration of 1 µg/g were added. The subsequent cleaning of 8 test wafers gave the average contamination values shown in Table 6. It can be seen here that EDTA does not have an adequate complex binding action with respect to the added metals in the dilute SC-1 solution at 70° C.

TABLE 6

Metal contamination on the wafer 3urface after SC-1 cleaning (1:4:20, 70° C.) with addition of 1 ng/g of Al, Ca, Fe, Ni, Cu, Zn and the complexing agent EDTA (1 ug/g):

| Cleaning solution | Metal contamination on the wafer surface ($10^{10}$ atoms per cm$^2$) | | | | |
|---|---|---|---|---|---|
| | Ca | Fe | Ni | Cu | Zn |
| SC-1 + metals (1 ng/g) + EDTA (1 µg/g) | 3.8 | 32 | <0.1 | 0.1 | 13 |

COMPARATIVE EXAMPLE 4

Dilute SC-1 cleaning solution with the addition of the complexing agent EDTA.

After preparation of the cleaning solution as above, the complexing agent ethylenediamine tetraacetate (EDTA) was added in a concentration of 1 μg/g. The subsequent cleaning of 8 test wafers gave the average contamination values shown in Table 7.

It can be seen that EDTA cannot adequately (compared with cTRAMP) complex the Fe, Ni, Cu and Zn ions present in the cleaning solution.

TABLE 7

Metal contamination on the wafer surface after SC-1 cleaning (1:4:20, 70° C.) with addition of complexing agent EDTA (1 ug/g)

| Cleaning solution | Metal contamination on the wafer surface ($10^{10}$ atoms per $cm^2$) | | | | |
|---|---|---|---|---|---|
| | Ca | Fe | Ni | Cu | Zn |
| SC-1 + EDTA (1 μg/g) | 6.7 | 2.6 | 0.3 | 0.1 | 4.2 |

COMPARATIVE EXAMPLE 5

Dilute SC-1 cleaning solution with addition of 1 ng/g of each of Al, Ca, Fe, Ni, Cu, Zn with and without complexing agent diethylenetriaminepenta (methylenephosphonic) acid ("DTTP").

In this experiment for studying the action of a novel complexing agent with respect to aluminum, the metal ions were added to the DIW (75° C.) before the addition of DTTP (4 μg/g), $H_2O_2$ and $NH_4OH$. The aluminum concentrations on wafers after SC-1 or after SC-1 with DTTP and after SC-1 with addition of metals (1 ng/g) and DTTP (4 μg/g) are shown in Table 8.

The results show a large increase of aluminum on the wafer surface after addition of the metals to the SC-1 solution. DTTP exhibits no action with respect to Al.

TABLE 8

Metal contamination on the wafer surface after SC-1 cleaning (1:4:20, 70° C.) with and without addition of 1 ng/g of Al, Ca, Fe, Ni, Cu, Zn and with and without complexing agent DTTP (4 ug/g)

| Cleaning solution | Metal contamination on the wafer surface ($10^{10}$ atoms per $cm^2$) Al |
|---|---|
| SC-1 + metals (1 ng/g) | 2000 |
| SC-1 | 100 |
| SC-1 + DTTP | 100 |

We claim:

1. An aqueous cleaning solution for cleaning a semiconductor substrate, comprising:
   a base;
   hydrogen peroxide; and
   a complexing agent being a crown ether having the formula:

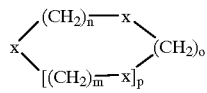

in which X is one of oxygen and sulfur, m, n and o are one of 2 and 3, and p is one of 1 and 2.

2. The aqueous cleaning solution according to claim 1, wherein said base is an organic base.

3. The aqueous cleaning solution according to claim 1, wherein said base is an inorganic base.

4. The aqueous cleaning solution according claim 1, wherein said complexing agent has a concentration of 0.01 to 1000 ppm in the aqueous cleaning solution.

5. The aqueous cleaning solution according to claim 1, wherein said base is selected from the group consisting of ammonia and a quaternary ammonium hydroxide.

6. The aqueous cleaning solution according to claim 2, wherein said organic base is from 0.01 to 20% by weight of the aqueous cleaning solution.

7. The aqueous cleaning solution according to claim 3, wherein said inorganic base is from 0.01 to 20% by weight of the aqueous cleaning solution.

8. The aqueous cleaning solution according to claim 1, wherein said hydrogen peroxide is from 0.01 to 30% by weight of the aqueous cleaning solution.

9. An aqueous cleaning solution for cleaning a semiconductor substrate, the improvement comprising:
   a base;
   hydrogen peroxide; and
   a complexing agent being a cryptand having the formula:

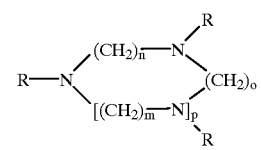

in which R radicals are at least one of hydrogen atoms, aliphatic chains bridging two nitrogen atoms each, identical functional groups, and different functional groups that affect at least one of:
   a) a solubility of said cryptand;
   b) an adduction of said cryptand onto the semiconductor substrate;
   c) a metal complexability; and
   d) a stability of said cryptand to oxidants, and m, n and o are one of 2 and 3, and p is one of 1 and 2.

10. The aqueous cleaning solution according to claim 9, wherein said base is an organic base.

11. The aqueous cleaning solution according to claim 9, wherein said base is an inorganic base.

12. The aqueous cleaning solution according to claim 9, wherein said functional groups are selected from the group consisting of carboxylic acid groups, (poly)methylenesulfonic acid groups, (poly)methylenesulfinic acid groups, (poly)methylenesulfenic acid groups, and salts thereof.

13. The aqueous cleaning solution according to claim 9, wherein said functional groups are selected from the group consisting of methylenephosphonic acid, polymethylenephosphonic acid groups, and salts thereof.

14. The aqueous cleaning solution according claim 9, wherein said complexing agent has a concentration of 0.01 to 1000 ppm in the aqueous cleaning solution.

15. The aqueous cleaning solution according to claim 9, wherein said base is selected from the group consisting of ammonia and a quaternary ammonium hydroxide.

16. The aqueous cleaning solution according to claim 10, wherein said organic base is from 0.01 to 20% by weight of the aqueous cleaning solution.

17. The aqueous cleaning solution according to claim 11, wherein said inorganic base is from 0.01 to 20% by weight of the aqueous cleaning solution.

18. The aqueous cleaning solution according to claim 9, wherein said hydrogen peroxide is from 0.01 to 30% by weight of the aqueous cleaning solution.

* * * * *